United States Patent
Cho et al.

(10) Patent No.: US 12,237,183 B2
(45) Date of Patent: Feb. 25, 2025

(54) SEMICONDUCTOR PROCESSING SYSTEM INCLUDING TEMPERATURE CONTROLLER

(71) Applicant: SAMSUNG ELECTRONICS CO., LTD., Suwon-si (KR)

(72) Inventors: Kyoungsik Cho, Suwon-si (KR); Hogon Kim, Hwaseong-si (KR); Myoungryul Han, Hwaseong-si (KR); Hyunchul Kwun, Chungcheongnam-do (KR); Dongha Kim, Hwaseong-si (KR); Jangho Son, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 133 days.

(21) Appl. No.: 17/210,686

(22) Filed: Mar. 24, 2021

(65) Prior Publication Data
US 2022/0139736 A1    May 5, 2022

(30) Foreign Application Priority Data
Nov. 3, 2020   (KR) .......................... 10-2020-0145290

(51) Int. Cl.
| | |
|---|---|
| H01L 21/67 | (2006.01) |
| C23C 16/458 | (2006.01) |
| C23C 16/46 | (2006.01) |
| C23C 16/52 | (2006.01) |
| H01J 37/32 | (2006.01) |

(52) U.S. Cl.
CPC .... *H01L 21/67103* (2013.01); *C23C 16/4583* (2013.01); *C23C 16/46* (2013.01); *C23C 16/52* (2013.01); *H01J 37/32724* (2013.01); *H01L 21/67069* (2013.01)

(58) Field of Classification Search
None
See application file for complete search history.

(56) References Cited

U.S. PATENT DOCUMENTS

| | | | |
|---|---|---|---|
| 6,350,320 B1 * | 2/2002 | Sherstinsky | H01J 37/3244 118/728 |
| 6,485,603 B1 * | 11/2002 | Yee | H01L 21/67115 156/345.48 |
| 7,397,648 B2 | 7/2008 | Otaka et al. | |
| 7,699,604 B2 | 4/2010 | Ito et al. | |
| 8,522,716 B2 * | 9/2013 | Kadkhodayan | C23C 16/505 427/523 |
| 9,818,587 B2 | 11/2017 | Ewert et al. | |
| 10,192,760 B2 | 1/2019 | Lee et al. | |

(Continued)

FOREIGN PATENT DOCUMENTS

| | | |
|---|---|---|
| JP | 2009231535 A | 10/2009 |
| JP | 101915460 B1 | 10/2018 |

*Primary Examiner* — Jeffrie R Lund
*Assistant Examiner* — Tiffany Z Nuckols
(74) *Attorney, Agent, or Firm* — Fish & Richardson P.C.

(57) ABSTRACT

A semiconductor processing system includes; a chamber, a substrate support disposed in the chamber, and a temperature controller including a thermal section disposed under the substrate support and a coupling section including at least one coupling section member. The thermal section includes a first plate and a second plate spaced apart under the substrate support, and each of the first plate and the second plate is coupled to a side portion of the substrate by at least one coupling section member.

19 Claims, 10 Drawing Sheets

(56) References Cited

U.S. PATENT DOCUMENTS

| | | | |
|---|---|---|---|
| 2001/0003334 A1* | 6/2001 | Kano | H01L 21/67103 |
| | | | 219/548 |
| 2002/0081173 A1* | 6/2002 | Croad | H01L 21/68785 |
| | | | 414/217 |
| 2003/0029568 A1* | 2/2003 | Brown | H01L 21/67069 |
| | | | 156/345.52 |
| 2005/0011752 A1* | 1/2005 | Yamazaki | C23C 16/45589 |
| | | | 204/192.15 |
| 2006/0098379 A1 | 5/2006 | Otaka et al. | |
| 2008/0032036 A1 | 2/2008 | Ito et al. | |
| 2008/0078326 A1* | 4/2008 | Sung | H01L 21/67069 |
| | | | 118/723 R |
| 2010/0043709 A1* | 2/2010 | Um | C23C 16/46 |
| | | | 118/724 |
| 2010/0319855 A1* | 12/2010 | Lee | C23C 16/4586 |
| | | | 156/345.52 |
| 2013/0126515 A1* | 5/2013 | Shero | H01L 21/67115 |
| | | | 219/448.11 |
| 2013/0270107 A1 | 10/2013 | Ewert et al. | |
| 2015/0083042 A1* | 3/2015 | Kobayashi | H01J 37/32357 |
| | | | 118/500 |
| 2016/0049317 A1 | 2/2016 | Lee et al. | |
| 2018/0237916 A1 | 8/2018 | Tzu et al. | |
| 2019/0051544 A1* | 2/2019 | Verbaas | H01L 21/67161 |

\* cited by examiner

SEMICONDUCTOR PROCESSING SYSTEM INCLUDING TEMPERATURE CONTROLLER

CROSS-REFERENCE TO THE RELATED APPLICATION

This application claims priority under 35 U.S.C. 119 to Korean Patent Application No. 10-2020-0145290 filed on Nov. 3, 2020 in the Korean Intellectual Property Office, the subject matter of which is hereby incorporated by reference.

BACKGROUND

1. Field

The inventive concept relates generally to semiconductor processing systems including a temperature controller. More particularly, the inventive concept relates to semiconductor processing systems including temperature controller that may be configured for use in deposition process(es) and/or annealing process(es).

2. Description of the Related Art

Semiconductor processing systems may be variously configured, but generally include a chamber capable of maintaining a desired temperature. A heater may be used to control the internal temperature of the chamber. However, it is often difficult to uniformly maintain the desired temperature across the entire reach of the chamber in certain semiconductor processing systems. For example, the temperature of a region near an inlet/outlet valve passing through a ceiling, side portion or bottom of the chamber may prove difficult to maintain at a steady state relative to other regions of the chamber.

Of additional note, a susceptor plate including a substrate support may be used to position and support a substrate within the chamber. In some embodiments, the susceptor plate may be made of a ceramic material in order to facilitate heat distribution.

SUMMARY

Embodiments of the inventive concept provide semiconductor processing systems capable of achieving improved heat distribution in relation to a substrate support.

According to one aspect of the inventive concept, there is provided a semiconductor processing system including; a chamber, a substrate support disposed in the chamber, and a temperature controller including a thermal section disposed under the substrate support and a coupling section including at least one coupling section members. The thermal section includes a first plate and a second plate spaced apart under the substrate support, and each of the first plate and the second plate is coupled to a side portion of the substrate by a coupling section member among the at least one coupling section member.

According to another aspect of the inventive concept, there is provided a semiconductor processing system including; a chamber, a substrate support disposed in the chamber and configured to seat a substrate, and a temperature controller configured to control application of heat, maintenance of heat and dissipation of heat with respect to the substrate support. Here, during a deposition process performed in the chamber at a temperature of at least 300° C., a temperature difference between a highest spot temperature and a lowest spot temperature for the substrate support is 29° C. or less.

According to still another aspect of the inventive concept, a semiconductor processing system includes; a chamber, a substrate support disposed in the chamber, and a temperature controller including a thermal section disposed under the substrate support and a coupling section, wherein the thermal section includes a plurality of divided plates arranged under the substrate support, and the coupling section includes a plurality of coupling section members respectively extending from at least two of the plurality of divided plates, a storage external to the chamber and configured to store a substrate, a slit valve between the chamber and the storage, a robot disposed in the chamber and configured to transfer the substrate between the storage and the substrate support. and a nozzle disposed at an upper portion of the chamber and configured to inject gas into the chamber during a deposition process. The substrate support includes a support base configured to seat the substrate, a support shaft disposed under the support base, a first ring region having a first height extending upward from an outer edge portion of the support base and a second ring region having a second height greater than the first height and disposed within the first ring.

BRIEF DESCRIPTION OF THE DRAWINGS

Embodiments of the inventive concept will be more clearly understood from the following detailed description taken in conjunction with the accompanying drawings in which.

DETAILED DESCRIPTION

Throughout the written description and drawings, like reference numbers and labels are used to denote like or similar elements and/or features.

Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
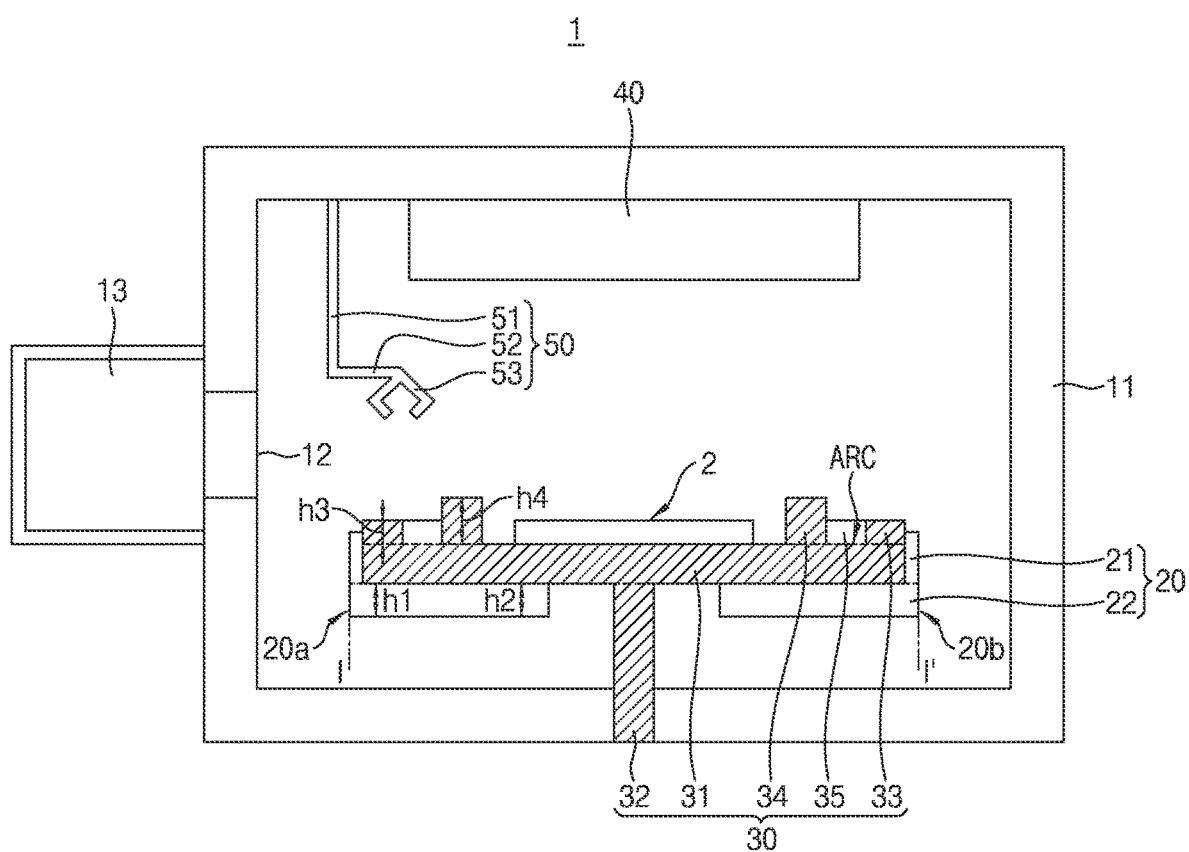
FIG. 1 is a side view illustrating a semiconductor processing system according to embodiments of the inventive concept.

FIG. 1 is a side view illustrating a semiconductor processing system 1 according to embodiments of the inventive concept.

Referring to FIG. 1, the semiconductor processing system 1 may include a chamber 11, a storage 13 disposed external to the chamber 11, a slit valve 12 passing between the chamber 11 and the storage 13, a temperature controller 20, a substrate support 30, a nozzle 40 and a robot 50. Here, each one of the temperature controller 20, the substrate support 30, the nozzle 40 and the robot 50 is disposed within the chamber 11.

The semiconductor processing system 1 may be selectively configured and variously used during one or more semiconductor process(es). For example, the semiconductor processing system 1 may be configured to perform one or more of deposition processes, etching processes, plasma-enhanced deposition and/or annealing processes. For example, the semiconductor processing system 1 may perform a high temperature process at about 300° C. or more. As used here, the term "about" may be understood as including a numerical range within +/−5% of a given nominal value or nominal range.

Certain semiconductor processing systems consistent with embodiments of the inventive concept may be used during various thin film deposition processes. In this context, a "deposition process" is a process during which a material to be synthesized is vaporized or sublimated into a gaseous state in a defined vacuum, such that atoms/molecules of the material may attached to an exposed surface of a substrate 2 (e.g., a crystalline silicon wafer) or a material layer already formed on the substrate 2 to form a thin film.

As will be appreciated by those skilled in the art, the chamber 11 may be variously controlled to generate and maintain a processing environment having a desired temperature and/or pressure. That is, the chamber 11 may be used to perform various processes during the fabrication of integrated circuits of a semiconductor device. Some of these processes may involve fast-changing temperature and/or pressure variations. Accordingly, the chamber 11 should be configured to rapidly generate and stably maintain desired temperature and/or pressure conditions. Although not shown in FIG. 1, the chamber 11 may include a heater coupled to an external heat-supply system in order to provide heat to the interior of the chamber 11.

The storage 13 may store one or more substrate(s) 2 which may in turn be mechanically loaded into or unloaded from the chamber 11. In order to facilitate the transfer of substrate(s) to/from the storage 13, the storage may be disposed external to the chamber 11, and a slit valve 12 may be provided between the chamber 11 and the storage 13. With this configuration, the storage 13 may be connected/disconnected from an outside wall of the chamber, and the slit valve 12 may be opened/closed to allow transfer of substrate(s) between the chamber 11 and the storage 13. That is, the substrate 2 may be transferred from storage 13 to the chamber 11 via the slit 12 so that a process may be performed on the substrate 2 in the chamber 11, and once the process has been performed, the substrate 2 may be transferred from the chamber 11 back to the storage 13 via the slit valve 12.

In this regard, the robot 50 may be used to transfer the substrate 2 between the chamber 11 and the storage 13 via the slit value 12. For example, the robot 50 may pick up the substrate 2 which is stored in the storage 13, and then position and place the substrate 2 on the substrate support 30. Thereafter following completion of processing, the robot 50 may pick up the substrate 2 from the substrate support 30, and then return the substrate 2 to the storage 13. In some embodiments, the robot 50 may be disposed at an upper portion of the chamber 11 to best facilitate the transfer of substrates. In the illustrated example of FIG. 1, the robot 50 is shown as including a vertically-movable shaft 51, a horizontally-extending arm 52 capable of circular movements around a lower end of the shaft 51 and a freely-moveable head 53 disposed at a distal end of the arm 52. However, those skilled in the art will recognize that the robot 50 may have any number of different configurations.

The substrate support 30 may be variously configured to receive, position and hold the substrate 2 once received from the robot 50. For example, the substrate 2 may be centrally and horizontally positioned and disposed (hereafter, "seated") on a top surface of the substrate support 30.

Of particular note in relation to embodiments of the inventive concept, the substrate support 30 may be configured to provide improved distribution of heat, as heat is applied to the substrate 2 once seated on the substrate support 30. In this regard, the substrate support 30 may be able to store heat (or thermal energy) for a predetermined period of time.

In the illustrated example of FIG. 1, the substrate support 30 includes a support base 31, a support shaft 32 disposed under the support base 31, a first ring 33 extending upward from an outer edge portion of the support base 31, a second ring 34 also extending upward and disposed within the first ring 33, and a coating film 35 at least partially filling a groove between the first ring 33 and the second ring 34. These exemplary components, one or more of which may be optionally provided, will be described in some additional detail hereafter, but collectively these components may be configured to facilitate the well-maintained provision of heat to the substrate 2 disposed on the substrate support 30.

In some embodiments, the support shaft 32 associated with the substrate support 30 may extend downward from a lower surface of the support base 31 to (or through) a lower surface (or portion) of the chamber 11. In some embodiments, the substrate support 30 may be rotated through the support shaft 30.

In the illustrated embodiment of FIG. 1, the temperature controller 20 may be used to control the temperature of the substrate 2 seated on the substrate support 30, and may generally include a coupling section 21 and a thermal section 22. These exemplary components will be described in some additional detail hereafter, but collectively these components may be configured to facilitate the well-maintained provision of heat to the substrate 2 seated on the substrate support 30.

In this regard, the temperature controller 20 may provide heat application, heat maintenance and/or heat dissipation capabilities. Here, the temperature controller 20 may be variously coupled (e.g., mechanically attached) to side portion(s) of the substrate support 30, such that the temperature controller 20 is placed in close proximity (e.g., direct contact) with portion(s) of the substrate support 30. In some embodiments, the temperature controller 20 may have a substantially L-shaped configuration that facilitates coupling between the temperature controller 20 and bottom and/or side surfaces of the substrate support 30.

In some embodiments, the temperature controller 20 may include multiple plates (e.g., a first plate 20a and a second plate 20b). That is, the temperature controller 20 may include the first plate 20a and the second plate 20b spaced apart across the horizontal extent (e.g., line I-I') of the substrate support 30.

Various embodiments of the inventive concept including the temperature controller 20 and the substrate support 30 and will be described hereafter in some additional detail in relation to FIGS. 2, 3 and 4.

Referring to FIG. 1, the nozzle 40 may be used to inject various gas(es) (or gas mixture(s)) used during processing of the substrate 2. For example, the nozzle 40 may inject one or more gas(es) including such elements as B, Al, Ga, In, Tl, Pd, Na, Be, Zn, Au, Co, V, Ni, Mo, Hg, Sr, Ge, Cu, K, Sn, W, Pb, O, Fe, Li, Sb, P, As, Bi, Te, Ti, C, Mg, Se, Cr, Ta, Cs, Ba, S, Mn, Ag, Cd, Pt, and Si. Although not shown in FIG. 1, those skilled in the art will understand that the nozzle 40 may be connected to a gas delivery system and/or a gas discharge system connected to the chamber 11. In some embodiments like the one shown in FIG. 1, the nozzle 40 may be centrally (or near centrally) disposed at an upper portion of the chamber 11 above the substrate support 30.

Figure 2:
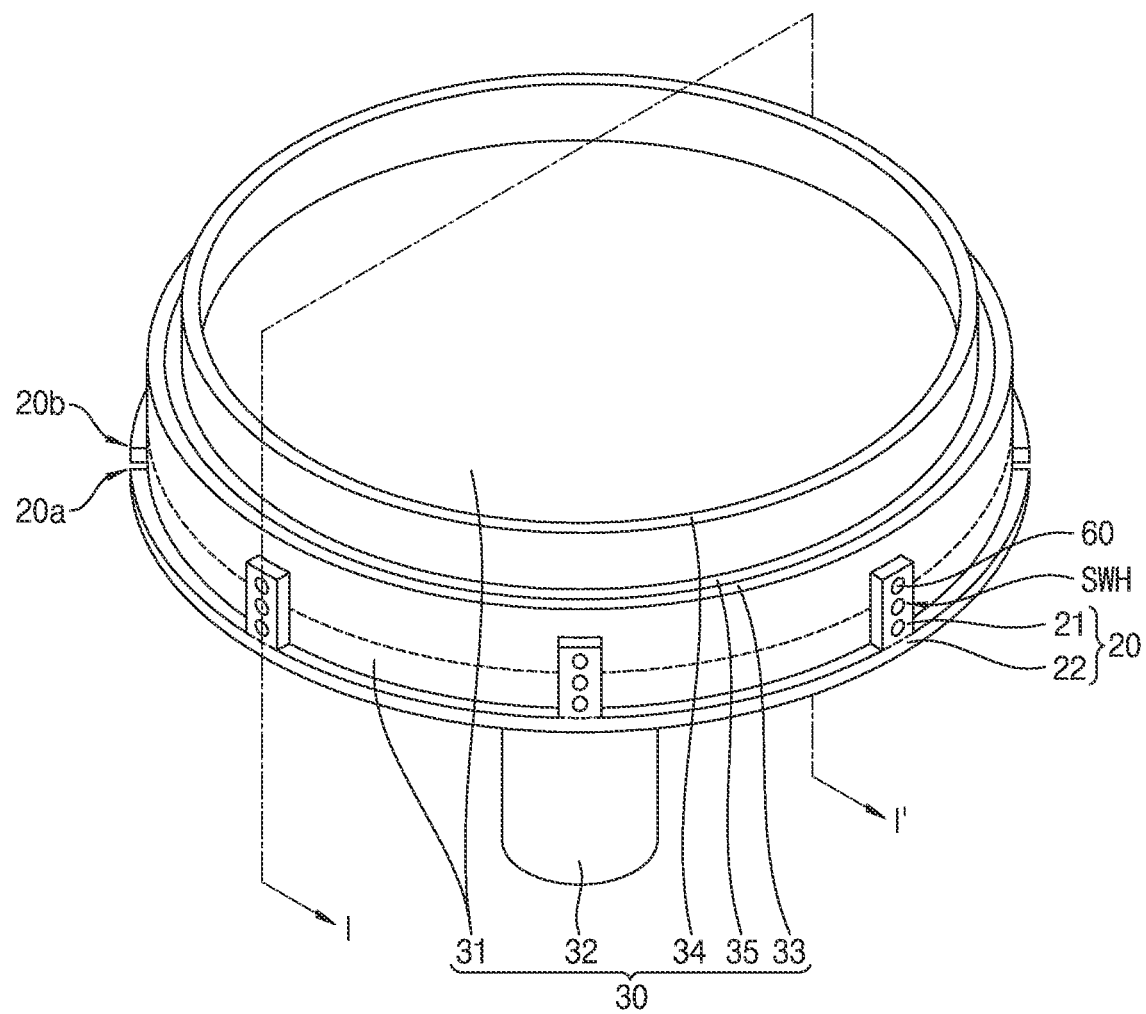
FIG. 2 is a perspective view illustrating a temperature controller coupled to a substrate support according to embodiments of the inventive concept.

FIG. 2 is a perspective view further illustrating in one example the temperature controller 20 and the substrate support of FIG. 1; FIG. 3 is an exploded perspective view further illustrating in one example the temperature controller 20 and the substrate support 30 of FIG. 2; and FIG. 4 is a cut-away perspective view further illustrating in one example the first plate 20a of FIG. 3.

Referring collectively to FIGS. 1, 2, 3 and 4 and as previously described, the substrate support 30 is assumed to include the support base 31, the support shaft 32, the first ring 33 and the second ring 34.

Here, the support base 31 include a substantially central, upper surface region in which the substrate 2 may be seated. In some embodiments, the support base 31 may have a substantially circular or elliptical shape and a defined thickness. That is, the support base 31 may be implemented as a relatively thin disc, however those skilled in the art will recognize that the support base 31 may have any reasonable shape, such as a rectangular shape, a polygonal shape, an oval shape, etc. In some embodiment, the upper surface of the support base 31, including the region seating the substrate 2, may be flat.

In some embodiments like the one illustrated in FIG. 2, the first ring 33 may extend upward from an outer edge portion of the support base 31, and the second ring 34 may also extend upward and be disposed within the circumference of the first ring 33. For example in some embodiments, an outer side portion of the first ring 33 may be disposed on (or very near) an outer edge of the support base 31 in order to facilitate the coupling of the temperature controller 20, and the second ring 34 may be disposed with the first ring 33 in such a manner that a combination of the first ring 33 and the second ring 34 form an effective susceptor ring.

In this regard, the susceptor ring may provide uniform heating to the seated substrate 2—at least in part (e.g.,) through an outer side portion of the substrate 2. Additionally, the susceptor ring may be appropriately sized to prevent movement (e.g., sliding) of the substrate 2 that may be caused by pressure differentials of injected gases that may be captured between a lower surface of the substrate and the support base 31 when the pressure of the chamber 11 is rapidly changed.

Thus, the susceptor ring (e.g., a combination of the first ring 33 and the second ring 34) may extend upward from the support base 31 to essentially capture the seated substrate 2. In some embodiments like the one illustrated in FIG. 1, the first ring 33 may extend upwardly to a third height (h3) above the upper surface of the substrate support 31, and the second ring 34 may extend upwardly to a fourth height (h4) above the upper surface of the substrate support 31. In some embodiments, the fourth height h4 of the second ring 34 may be greater than the third height h3 of the second ring 33.

In some embodiments, the first ring 33 and the second ring 34 may be spaced apart by a defined groove (or gap), indicated in FIG. 1 by the notation 'ARC.' Here, the height (or thickness, as measured (e.g.,) in a vertical direction) of the groove will be no greater than the lesser of the third height h3 and the fourth height h4, and may have a concaved upper surface.

In some embodiments, the support shaft 32 may extend through the lower portion of the chamber 11 to allow the through-connection of certain external components, such as a support shaft driving mechanism, various mechanical and/or electrical connections, a heat-providing system, a pressure providing system, etc. In some embodiments, the support shaft 32 may have a substantially cylindrical shape and may be hallow to facilitate various through-connections.

Here, one or more of the support base 31, the support shaft 32, the first ring 33 and the second ring 34 may include one or more materials, such as ceramic, aluminum nitride, Ni, Ni alloy, silicon carbide coated graphite, solid silicon carbide, solid sintered silicon carbide, solid metal-free sintered silicon carbide, etc.

In some embodiments, the coating film 35 may be provided to an appropriate thickness to at least partially fill the groove (ARC of FIG. 1) between the first ring 33 and the second ring 34. Here, in some embodiments, the coating film 35 may include a rougher (e.g., more textured) material than the material(s) used to form the support base 31, the support shaft 32, the first ring 33 and the second ring 34. Accordingly, the exposed upper surface of the coating film 35 serve as a collector for particles undesirable produced during certain semiconductor process(es). In some embodiment, the coating film 35 may include one or more metals, such as Al or Al alloy. Thus, depending on its constituent materials, the coating film 35 may be formed on the support base 31 to fill or cover the groove between the first ring 33 and the second ring 34 using an arc welding technique.

As noted above, the temperature controller 20 may generally be used to control the temperature of the substrate support 30 and/or the temperature of a substrate seated on the substrate support 30. In this regard, the temperature controller 20 may be understood as providing a heat application function, a heat maintenance function and/or a heat dissipation function in relation to the substrate support 30. Accordingly, the temperature controller 20 may include different materials having different thermal properties in order to provide different thermal functions. For example, the temperature controller 20 may include one or more metal(s) having excellent heat maintenance (or retention) properties in order to provide an acceptable heat maintenance function. For example, the temperature controller 20 may include steel use stainless (SUS) (e.g., a stainless metal). Additionally or alternately, the temperature controller 20 may include one or more metal(s) having excellent heat dissipation properties in order to provide an acceptable heat dissipation function. For example, the temperature controller 20 may include Cu and/or Al.

As illustrated in FIG. 1, for example, the temperature controller 20 may include a thermal (e.g., a thermal functioning) section 22 and a (attaching/detaching) coupling section 21, wherein the coupling section 21 (or respective coupling section members) extends upward from the thermal section 22. In some embodiments like the ones illustrated in FIGS. 2, 3 and 4, the thermal section 22 may include the first plate 20a and the second plate 20b. (Of note, the description of the first plate 20a provided hereafter may be applied to the second plate 20b).

Within embodiments of the inventive concept, the thermal section 22 is substantially responsible for the application, maintenance and/or dissipation of heat in relation to the substrate support 30.

In some embodiments, the thermal section 22 may have an arcuate flat plate shape including a flat upper surface. (See, e.g., the combination of the first plate 20a and second plate 20b of FIG. 3).

Figure 4:
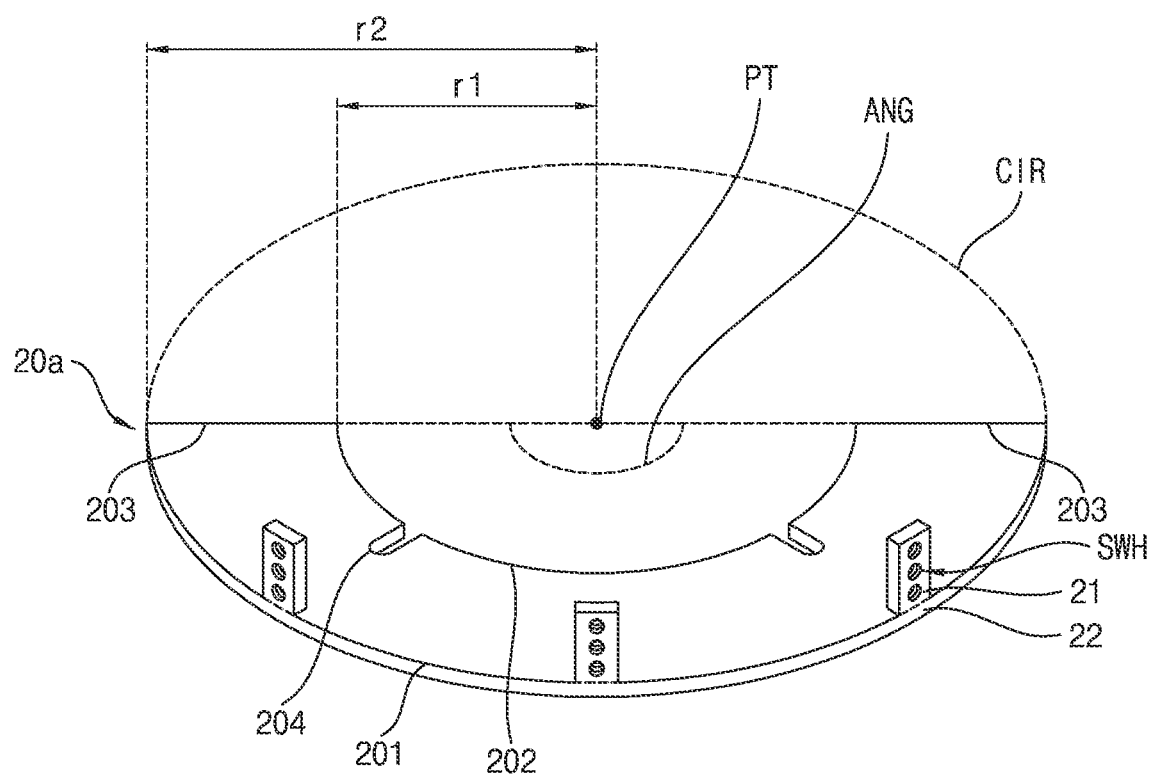
FIG. 4 is a perspective view further illustrating in one example the first plate of FIG. 3.

In the illustrated example of FIG. 4, each one of the first plate 20a and the second plate 20b forming the thermal section 22 has a semi-annular shape (i.e., one type of arcuate shape) in which a central portion around a center point PT of a virtual circle CIR encompassing the first plate 20a and the second plate 20b has been removed. Here, the upper surface of the thermal section 22 may be placed in close proximity to a lower surface of the support base 31. That is, the upper surface of the thermal section 22 may have an arcuate shape (with opposing sides 203) defined between by an outer arc 201 and an inner arc 202. In this regard, the outer arc 201 may overlay the virtual circle CIR, wherein an angle ANG formed by the opposing sides 203 about the center PT of the virtual circle CIR may extend from about 10° to about 360°. For example, with reference to the center PT, a first radius r1 defining the inner arc 202 may be about 280 mm or less, and a second radius r2 defining the outer arc 201 may be about 360 mm or less.

Additionally, the thermal section 22 may include at least one notch 204 formed in the inner arc 202. Although not shown in FIG. 4, a fixing pin may be used in associated with the notch 204 to properly seat the thermal section 22 onto the lower surface of the substrate support 30.

In some embodiments, the thermal section 22 may be formed with a constant or a variable height (or material(s) thickness). For example as illustrated in FIG. 1, the height of the thermal section 22 may vary from a first height (h1) of about 2 mm to a second height (h2) of about 10 mm, wherein the first height h1 corresponds with outer portions of the thermal section 22 and the second height h2 corresponds to an inner portion of the thermal section 22. Alternately the first height h1 and the second height h2 may be substantially the same.

With the foregoing configuration, the inner arc 202 of the temperature controller 20 may form a hole through which the support shaft 32 passes to connect the substrate support 30.

The coupling section 21 of the temperature controller 20 may be used to couple (e.g., attach and/or detach) the thermal section 22 to the substrate support 30. In some embodiments, the coupling section 21 may include multiple coupling section members 21 protruding upward from the outer edge portion of the thermal section 22. Thus, as illustrated in FIG. 4, at least one coupling section member 21 may extend upward from the first plate 20a (e.g., part of the thermal section 22).

In some embodiments, each coupling section member 21 may include a plurality of vertically aligned coupling holes (SWH), wherein each of the plurality of coupling holes extends through the body of the coupling section 21. In some embodiments, each coupling hole SWH may be internally threaded to receive a fastener. Once inserted through a corresponding coupling hole SWH, each fastener SWH may contact the outer side portion of the first ring 33 and/or the outer side portion of the support base 31 in order to firmly couple the temperature controller 20 to the substrate support 30. In some embodiments, one or more fasteners may be used in conjunction with one or more (respectively associated) coupling holes SWH to couple the temperature controller 20 to the substrate support 30. Here, each fastener may be a screw, a bolt, a nail, etc.

Here, it should be noted that the thermal section 22 has been illustrated with only two (2) constituent plates arranged in an arcuate shape (e.g., the first plate 20a and the second plate 20b). However, those skilled in the art will recognize that the thermal section 22 might alternately include three (3) or more plates configured such that they may be arranged under the lower surface of the substrate support 30

Figure 3:
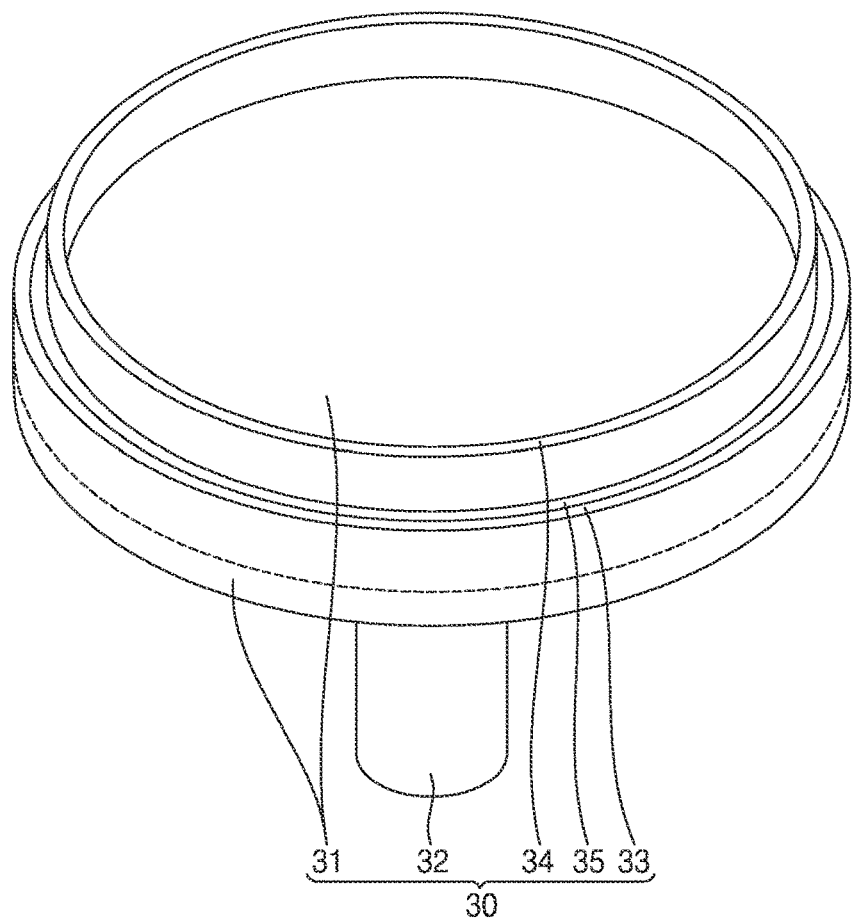
FIG. 3 is an exploded perspective further illustrating the temperature controller and the substrate support of FIG. 2.
Figure 3:
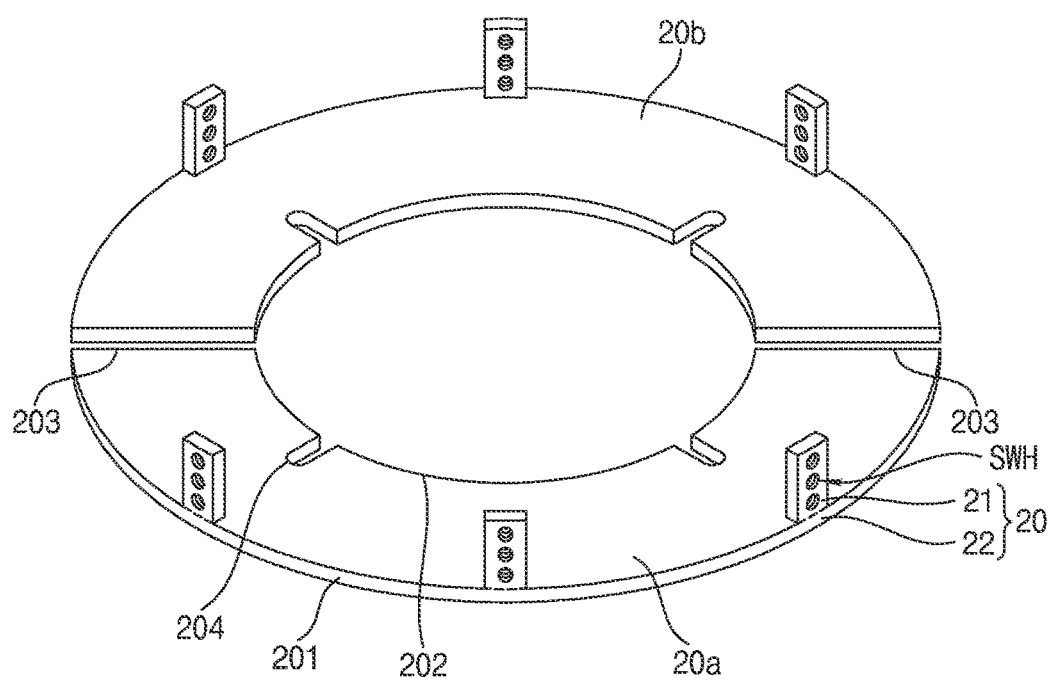

As illustrated in FIGS. 2, 3 and 4, a plurality of coupling holes SWH may be vertically aligned. As such, a separation distance between each respective plate of the thermal section 22 and the support base 31 of the substrate support 30 may be adjusted in accordance with the selection of a particular coupling hole SWH to which a fastener may be applied. Here, for example, the upper surface of the thermal section 22 and the lower surface of the support base 31 may directly contact each other, or may be separated by a separation distance ranging from between about 50 mm or less. Alternately, coupling holes may be variously (and non-linearly) arranged in each coupling section member of the coupling section 21 to effectively couple the temperature controller 20 to substrate support 30.

In some embodiments, the first plate 20a and the second plate 20b may have substantially the same shape. For example, the thermal sections 22 of the first plate 20a and the second plate 20b may have substantially the same area when viewed in a plan (or top-down). With this configuration, the first plate 20a and the second plate 20b may be symmetrically coupled to the substrate support 30. Thus, in some embodiments, each of the first plate 20a and the second plate 20b may be characterized by an angle ANG relative to the center PT of the virtual circle that ranges about 170 to 180°. In this manner, the combination of the first plate 20a and the second plate 20b may cover substantially all of the lower surface of the support base 31.

In the foregoing embodiments, the thermal section 22 may be understood as being disposed in a horizontal plane, and the coupling section 21 may be understood as extending in a vertical direction from this plane. Accordingly, the temperature controller 20 may be understood as having an L-shape (or L-shaped cross-section) extending from portions of the lower surface of the substrate support 31 to the outer side portion of the substrate support 31 and the outer side portion of the first ring 33. In this regard, the coupling section 21 may be understood as extending upward at a right angle (90°) from the thermal section 22.

Experimental results provided by the semiconductor processing systems according to the embodiment of the inventive concept, show that it is possible to control the temperature variance across the entirety of the support base 31 to a range of 29° C. or less. That is, using any one of the foregoing embodiments, it is possible to reduce a difference between a highest spot temperature on the substrate support 31 and a lowest spot temperature on the substrate support 31 to no more than 29° C. In this regard, a "spot temperature" is a discrete temperature measured at a particular portion (or spot) of the substrate support under a defined set of environmental conditions (e.g., temperature and pressure) during a particular process (e.g., a deposition process).

FIGS. 5, 6, 7 and 8 are respective perspective views further illustrating in various examples the temperature controller 20 of FIGS. 1, 2, 3 and 4 according to embodiments of the inventive concept.

Figure 5:
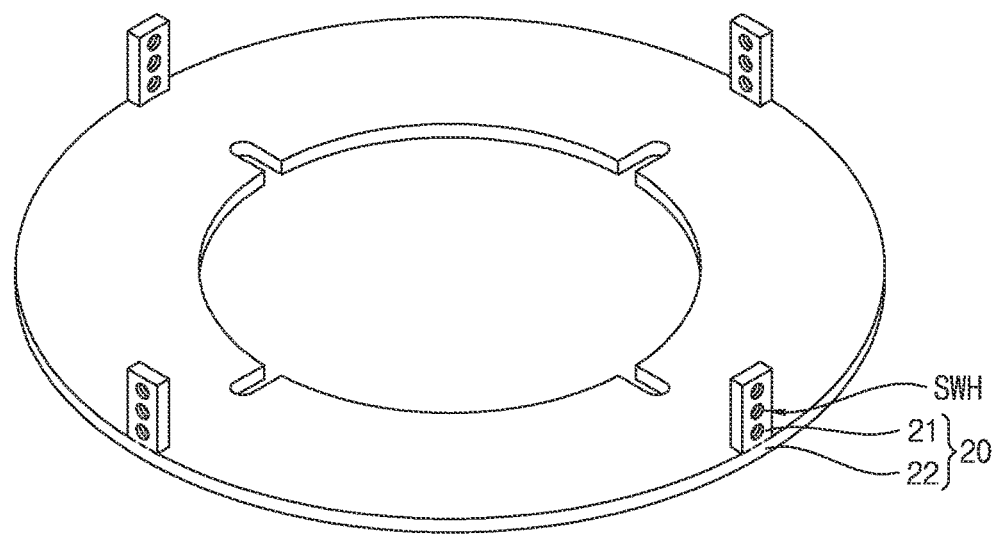
FIGS. 5, 6, 7, and 8 are respective perspective views further illustrating in various examples the temperature controller of FIG. 3.

Referring to FIG. 5, a temperature controller 20-1 may include a thermal section 22 including a single plate having an annular ring shape, and a coupling section 21 including four (4) coupling sections members and four (4) notches 204 disposed in corresponding, quadrilateral arrangements.

Figure 6:
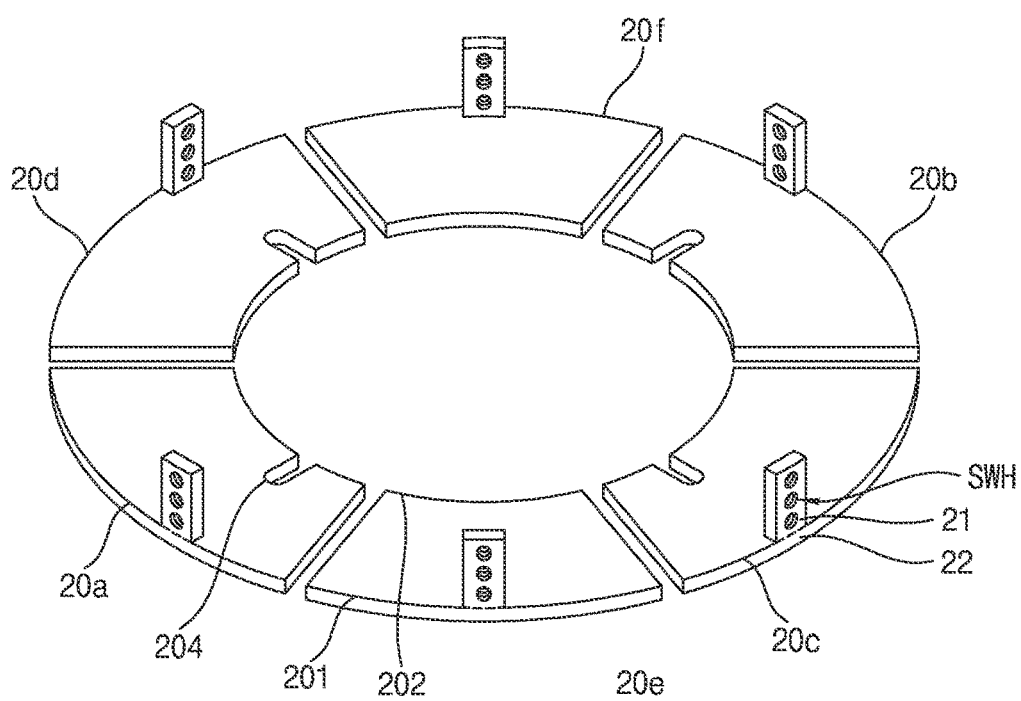

Referring to FIG. 6, a temperature controller 20-2 may include a thermal section 22 including a plurality of divided plates (e.g., six (6)) plates (e.g., first plate 20a, second plate 20b, third plate 20c, fourth plate 20d, fifth plate 20e, and six plate 20f) (hereafter collectively the "first to sixth plates 20a to 20f"). Here, some (but not necessarily all) of the first to sixth plates 20a to 20f may not include a notch 204. Further, each one of the first to sixth plates 20a to 20f includes a corresponding coupling section member of the coupling section 21, and respective ones of the first to sixth plates 20a to 20f may have substantially the shape and size (excepting only the presence or absence of a notch 204). Here, the plurality of divided plates may be coherently arranged into the thermal section 22 having a desired (e.g., arcuate) shape. Of note, once the plurality of divided plates forming the thermal section 22 of FIG. 6 is arranged, the thermal section 22 will cover a substantial portion of the lower surface of the substrate support 31.

Figure 7:
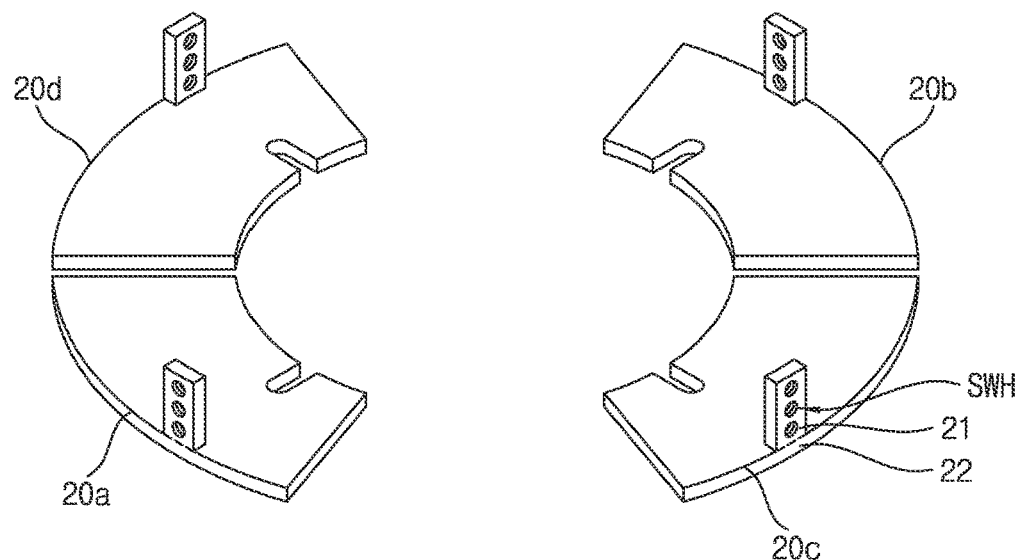

Referring to FIG. 7, a temperature controller 20-3 may include a thermal section 22 including a plurality of divided plates (e.g., four (4)) plates (e.g., first plate 20a, second plate 20b, third plate 20c and fourth plate 20d). When compared with the temperature controller 20-1 of FIG. 5 and the temperature controller 20-2 of FIG. 6, the temperature controller 20-3 of FIG. 7 allows much faster heat dissipation (and therefore less heat maintenance) since the resulting thermal section 22 of the temperature controller 20-3 covers significantly less of the lower surface of the substrate support 30.

Figure 8:
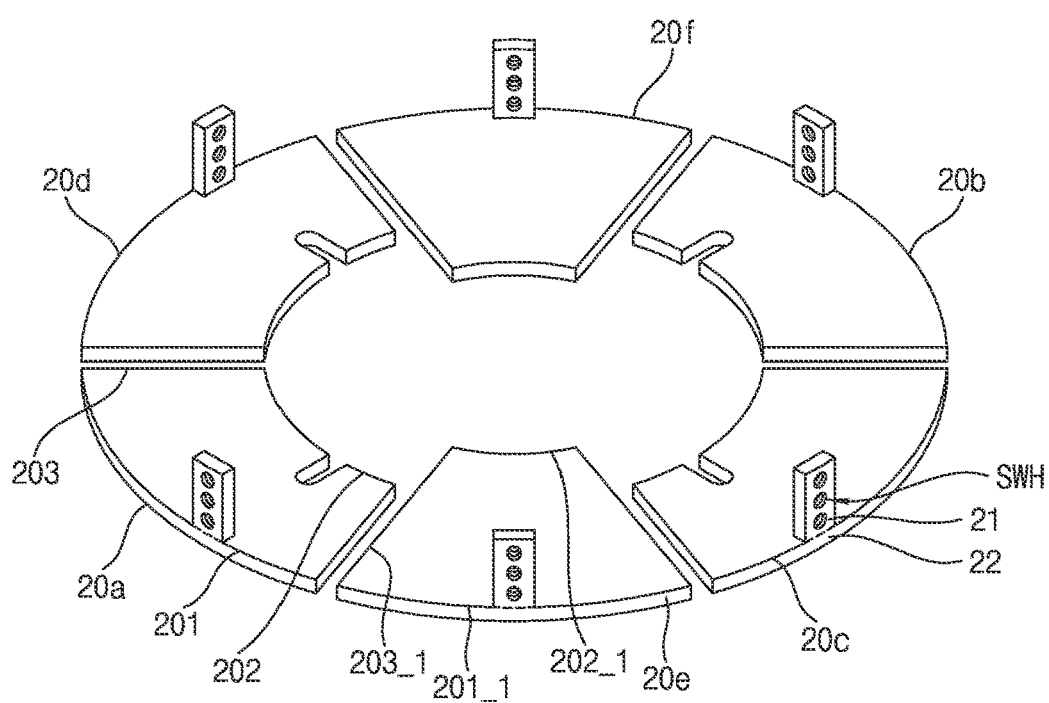

Referring to FIG. 8, a temperature controller 20-4 including a thermal section 22 is substantially the same as the temperature controller 20-2 of FIG. 6, except that some (or all) of the first to sixth plates 20a to 20f may have different shapes, different sizes, different material compositions, and/or different thicknesses. Here, for example, the inner edges of the fifth plate 20e and the sixth plate 20f are extended more deeply into the central portion of the thermal section 22 to cover an even greater portion of the lower surface of the substrate support 31, thereby enhancing the application of heat and the maintenance of heat in relation to the substrate support 31.

Figure 9:
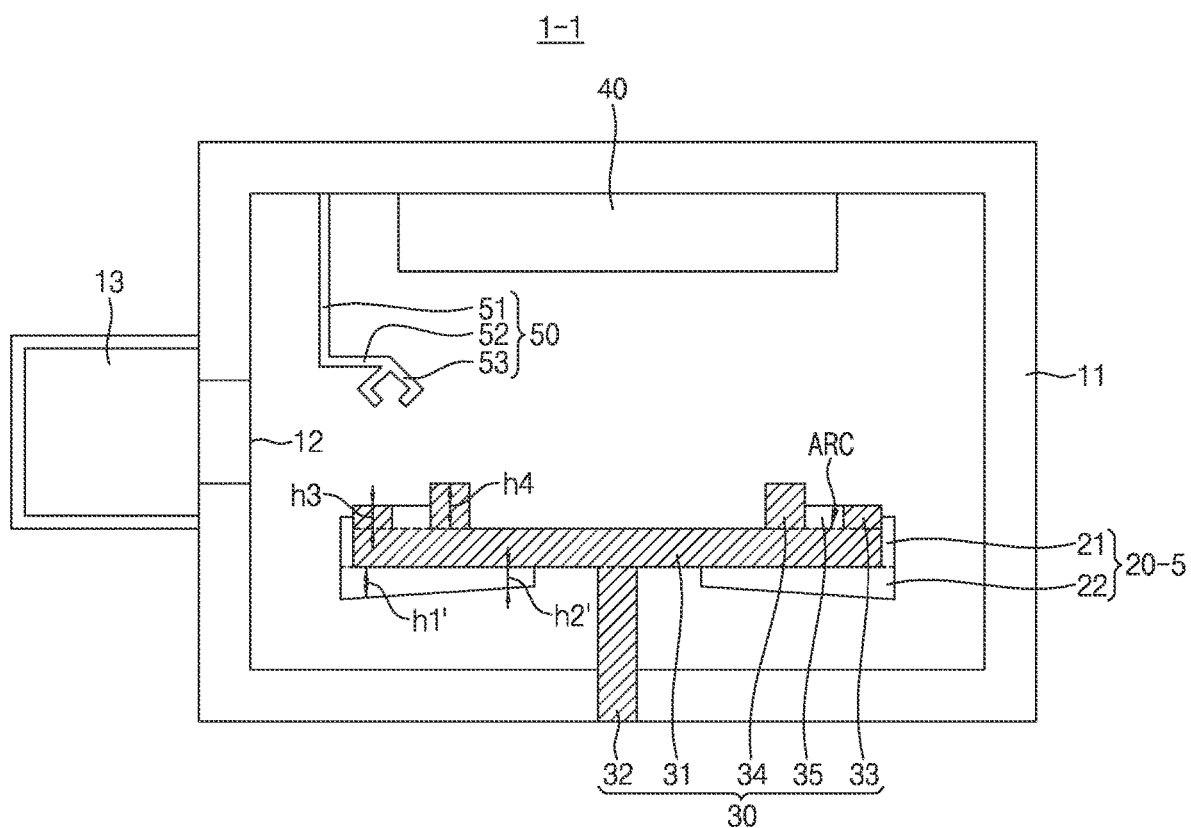
FIGS. 9, 10, 11 and 12 are respective side views illustrating various semiconductor processing systems according to embodiments of the inventive concept.
Figure 10:
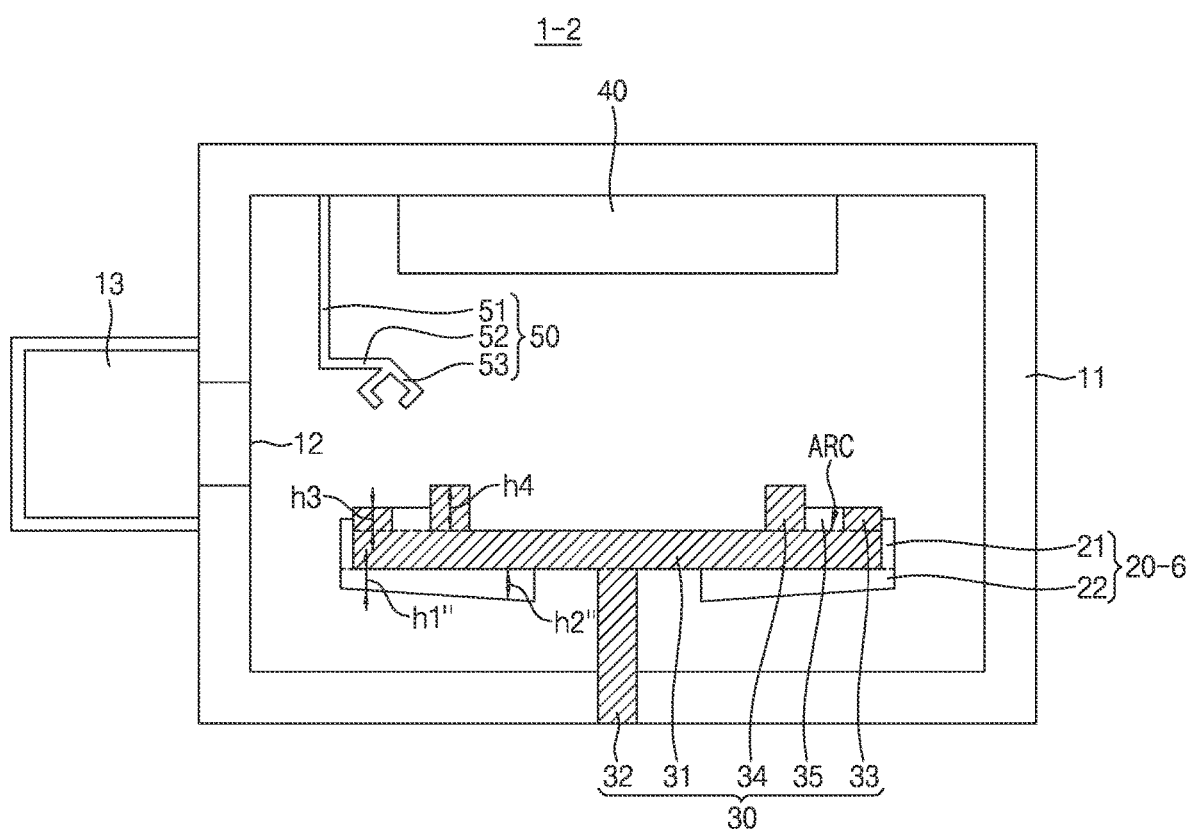

FIGS. 9 and 10 are respective side views illustrating semiconductor processing systems according to embodiments of the inventive concept.

The semiconductor processing system 1 of FIG. 1 includes the thermal section 22 of the temperature controller 20 has a substantially constant height (or material thickness). That is, the first (or outer) height h1 is substantially the same as the second (or inner) height h2). By way of comparison, the semiconductor processing system 1-1 of FIG. 9 includes a temperature controller 20-5 wherein the first (outer) height h1 is greater than the second (inner) height h2, and the semiconductor processing system 1-2 of FIG. 10 includes a temperature controller 20-6 wherein the first (outer) height h1 is less than the second (inner) height h2. Here, the relative heights (or material thicknesses) of different portions of the thermal section 22 of a particular temperature controller 20 will influence the heat application, heat maintenance and/or heat dissipation capabilities of the temperature controller 20.

Figure 11:
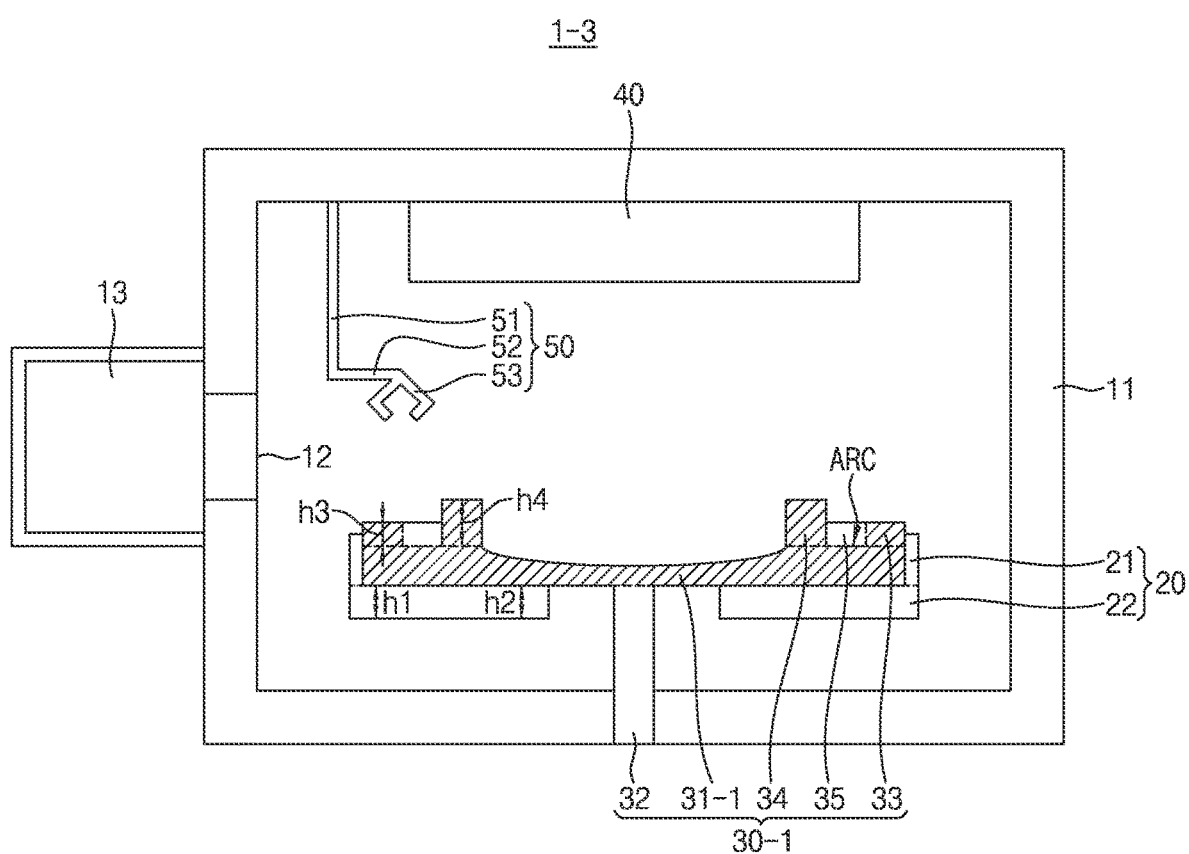
Figure 12:
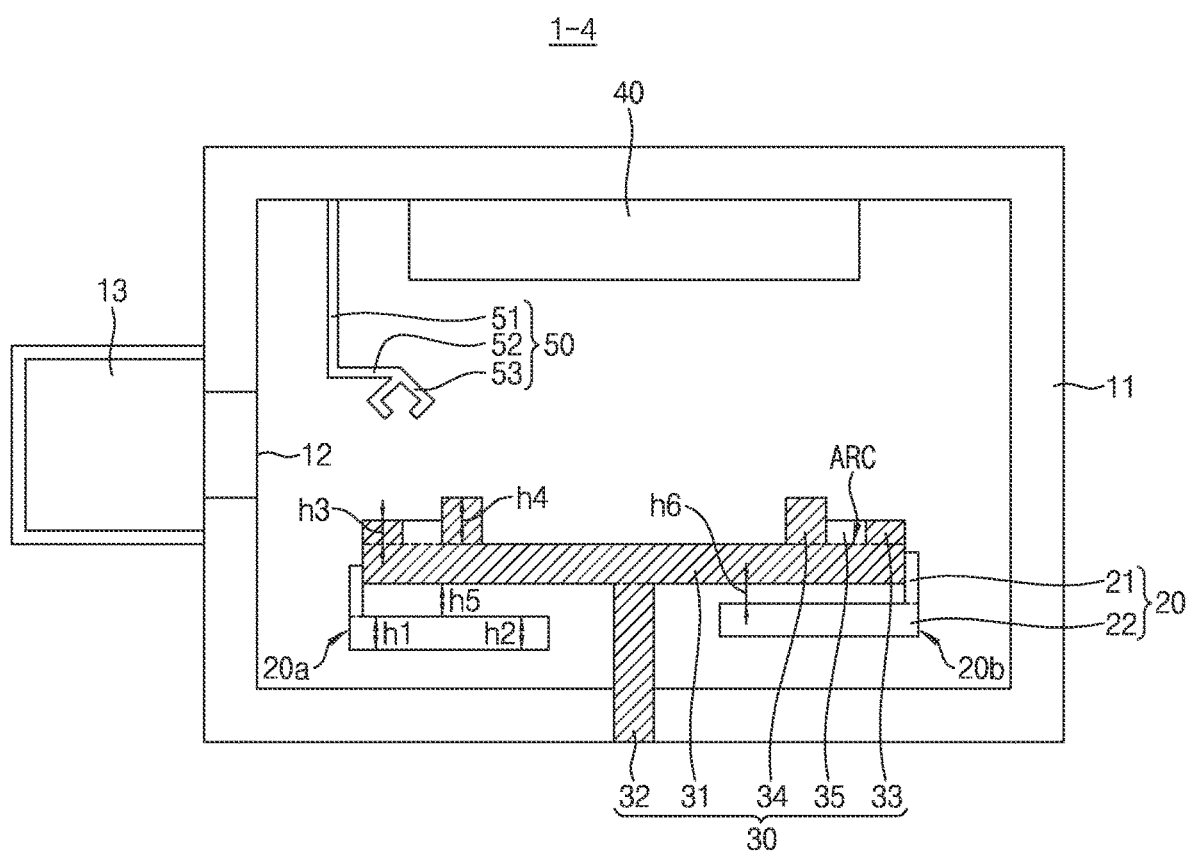

FIGS. 11 and 12 are respective side views illustrating semiconductor processing systems according to embodiments of the inventive concept.

Referring to FIG. 11, an upper surface of the support base 31 in the semiconductor processing system 1-3 may be slightly concaved in order to better receive a seated substrate. Further, the concaved upper surface of the support base 31 may improve heat distribution relative to the seated substrate.

Referring to FIG. 12, the first plate 20a and the second plate 20b of a semiconductor processing system 1-4 may disposed at different vertical distances with respect to the lower surface of the support base 31 of the substrate support 30. For example, a first separation distance h5 between the first plate 20a and the support base 31 may be greater than a second separation distance h6 between the second plate 20b and the baser region 31.

Embodiments of the inventive concept provide semiconductor processing systems capable of minimizing temperature variations (e.g., a range between a highest spot temperature and a lowest spot temperature) across a substrate support.

While the embodiments of the inventive concept have been described with reference to the accompanying drawings, those skilled in the art will understand that various modifications may be made without departing from the scope of the inventive concept as defined by the accompanying claims.

What is claimed is:

1. A semiconductor processing system, comprising:
   a chamber;
   a substrate support disposed in the chamber, the substrate support having an outer periphery surrounding a horizontal upper surface, the outer periphery defined by a vertical outer sidewall; and
   a temperature controller including a thermal section disposed under the substrate support and a coupling section including at least one coupling section member protruding upward from an outermost edge portion of the thermal section,
   wherein the thermal section includes a first plate and a second plate spaced apart in a horizontal direction under the substrate support,
   wherein the first and second plates each include a planar upper surface that lies in a same horizontal plane that is parallel with the horizontal upper surface of the substrate support, and outer peripheries of the planar upper surface of each of first and second plates extend past and are curved along respective vertical outer sidewall portions of the substrate support, and
   wherein each of the first plate and the second plate is coupled to an outer side portion of the substrate support by a coupling section member from among the at least one coupling section member, and each coupling section member extends vertically upward from the planar upper surface of a respective one of the first and second plates along the vertical outer sidewall of the substrate support and is attached to the vertical outer sidewall of the substrate support.

2. The semiconductor processing system of claim 1, wherein the substrate support incudes a ceramic, and the temperature controller includes steel use stainless (SUS).

3. The semiconductor processing system of claim 1, wherein each of the at least one coupling section member includes a plurality of vertically aligned coupling holes.

4. The semiconductor processing system of claim 3, further comprising:
   a fastener extending through each of the at least one coupling section member to couple the temperature controller to the outer side portion of the substrate support.

5. The semiconductor processing system of claim 1, wherein each of the first plate and the second plate has a semi-annular shape.

6. The semiconductor processing system of claim 5, wherein the semi-annular shape extends at an angle ranging from about 170° to about 180° with respect to a center point of a virtual circle encompassing the first plate and the second plate.

7. The semiconductor processing system of claim 5, wherein the semi-annular shape is defined by an inner arc having a radius of 280 mm or less extending from a center point of a virtual circle encompassing the first plate and the second plate, and an outer arc having a radius of 360 mm or less extending from the center point of the virtual circle.

8. The semiconductor processing system of claim 1, wherein the thermal section has a substantially uniform thickness that ranges from between about 2 mm to about 10 mm.

9. The semiconductor processing system of claim 1, wherein the thermal section has a thickness that varies from an outer portion of the thermal section to an inner portion of the thermal section.

10. The semiconductor processing system of claim 1, wherein an upper surface of the thermal section directly contacts a lower surface of the substrate support.

11. The semiconductor processing system of claim 1, wherein an upper surface of the thermal section is spaced apart from a lower surface of the substrate support.

12. The semiconductor processing system of claim 1, wherein the substrate support comprises:
a support base configured to seat a substrate;
a first ring having a first height extending upward from an outer edge portion of the support base; and
a second ring having a second height greater than the first height and disposed within the first ring,
wherein each coupling section member extends along an outer side surface of the first ring of the substrate support.

13. The semiconductor processing system of claim 12, wherein the first ring and the second ring are spaced apart by a groove and the substrate support further includes a coating film at least partially filling the groove.

14. The semiconductor processing system of claim 13, wherein the coating film includes aluminum (Al).

15. A semiconductor processing system comprising:
a chamber;
a substrate support disposed in the chamber and configured to seat a substrate, the substrate support having an outer periphery surrounding a horizontal upper support surface, the outer periphery defined by a vertical outer sidewall;
a temperature controller configured to control application of heat, maintenance of heat and dissipation of heat with respect to the substrate support,
wherein during a deposition process performed in the chamber at a temperature of at least 300° C., a temperature difference between a highest spot temperature and a lowest spot temperature of the substrate support is 29° C. or less,
wherein the temperature controller comprises a thermal section including a plurality of divided plates that are spaced apart in a horizontal direction and configured to be arranged under the substrate support and directly contacting the substrate support,
wherein the plurality of divided plates each includes a planar upper surface that lies in a same horizontal plane that is parallel with the horizontal upper support surface of the substrate support, and outer peripheries of the planar upper surfaces of the plurality of divided plates extend past and are curved along respective vertical outer sidewall portions of the substrate support,
wherein the temperature controller further comprises a coupling section configured to couple the thermal section to the vertical outer sidewall portions of the substrate support, and the coupling section includes a plurality of coupling section members respectively extending vertically upward from the planar upper surface of at least two of the plurality of divided plates and are attached to the vertical outer sidewall of the substrate support.

16. The semiconductor processing system of claim 15, further comprising:
a storage disposed external to the chamber and configured to store the substrate;
a slit valve between the chamber and the storage; and
a robot disposed within the chamber and configured to transfer the substrate between the storage and the substrate support.

17. The semiconductor processing system of claim 15, wherein at least first and second plates from among the plurality of divided plates have at least one of different sizes, different shapes, different material compositions and different thicknesses.

18. A semiconductor processing system comprising:
a chamber;
a substrate support disposed in the chamber, the substrate support having an outer periphery surrounding a support base configured to seat a substrate, and the support base having a horizontal upper surface and the outer periphery defined by a vertical outer sidewall; and
a temperature controller including a thermal section disposed under the substrate support and a coupling section, wherein the thermal section includes a plurality of divided plates that are spaced apart in a horizontal direction and arranged under the substrate support, and the coupling section includes a plurality of coupling section members respectively extending from at least two of the plurality of divided plates;
a storage external to the chamber and configured to store a substrate;
a slit valve between the chamber and the storage;
a robot disposed in the chamber and configured to transfer the substrate between the storage and the substrate support; and
a nozzle disposed at an upper portion of the chamber and configured to inject gas into the chamber during a deposition process,
wherein a support shaft disposed under the support base, and a susceptor ring including a first ring having a first height extending upward from an outer edge portion of the support base and a second ring having a second height greater than the first height and disposed radially inward of and spaced apart from the first ring,
wherein the plurality of divided plates each include a planar upper surface that lies in at least one horizontal plane that is parallel to the horizontal upper surface of the support base, and outer peripheries of each planar surface of the plurality of divided plates extend past and are curved along respective vertical outer sidewall portions of the substrate support, and
wherein each coupling section member extends vertically from the planar surface of a respective one of the plurality of divided plates and is attached to the vertical outer sidewall of the substrate support.

19. The semiconductor processing system of claim 18, wherein an upper surface of a first plate from among the plurality of divided plates is separated from a lower surface of the substrate support by a first separation distance, when the temperature controller is coupled to the substrate support, an upper surface of a second plate from among the plurality of divided plates is separated from the lower surface of the substrate support by a second separation distance different from the first separation distance, when the temperature controller is coupled to the substrate support, and the first separation distance and the second separation distance vary between about 0 mm and about 50 mm.

* * * * *